United States Patent
Bojarczuk et al.

(10) Patent No.: US 10,304,979 B2
(45) Date of Patent: May 28, 2019

(54) IN SITU NITROGEN DOPING OF CO-EVAPORATED COPPER-ZINC-TIN-SULFO-SELENIDE BY NITROGEN PLASMA

(71) Applicant: INTERNATIONAL BUSINESS MACHINES CORPORATION, Armonk, NY (US)

(72) Inventors: Nestor A. Bojarczuk, Poughkeepsie, NY (US); Talia S. Gershon, White Plains, NY (US); Supratik Guha, Chappaqua, NY (US); Marinus Hopstaken, Carmel, NY (US); Byungha Shin, Daejeon (KR)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 662 days.

(21) Appl. No.: 14/609,985

(22) Filed: Jan. 30, 2015

(65) Prior Publication Data
US 2016/0225927 A1 Aug. 4, 2016

(51) Int. Cl.
C23C 14/00 (2006.01)
H01L 31/032 (2006.01)
C23C 14/06 (2006.01)

(52) U.S. Cl.
CPC ...... H01L 31/0326 (2013.01); C23C 14/0026 (2013.01); C23C 14/0623 (2013.01); Y02E 10/50 (2013.01)

(58) Field of Classification Search
CPC . H01L 31/0326; H01L 31/18; C23C 14/0623; C23C 14/0026; Y02E 10/50
See application file for complete search history.

(56) References Cited

U.S. PATENT DOCUMENTS 5,505,986 A * 4/1996 Velthaus ............ C09K 11/7718
427/248.1
6,664,570 B1 12/2003 Yao et al.
(Continued)

FOREIGN PATENT DOCUMENTS

JP 03093608 A * 4/1991
JP 07291790 A * 11/1995
JP 2008078200 A * 4/2008

OTHER PUBLICATIONS

List of IBM Patents or Patent Applications Treated as Related; (Appendix P), Filed Jun. 18, 2015; 2 pages.
Nestor A Bojarczuk et al., "In Situ Nitrogen Doping of Co-Evaporated Copper-Zinc-Tin-Sulfo-Selenide by Nitrogen Plasma", U.S. Appl. No. 14/743,080, filed Jun. 18, 2015.
(Continued)

*Primary Examiner* — Yuechuan Yu
(74) *Attorney, Agent, or Firm* — Cantor Colburn LLP; Vazken Alexanian

(57) ABSTRACT

A method and apparatus for manufacturing a nitrogen-doped CZTSSe layer for a solar cell is disclosed. A substrate is mounted in a vacuum chamber. A plurality of effusion cells are placed within the vacuum chamber in order to evaporate copper, zinc, tin, sulfur, and/or selenium to form elemental vapors in a region proximate the substrate. An RF-based nitrogen source delivers a nitrogen plasma in the region proximal to the substrate. The elemental vapors and the nitrogen plasma form a gas mixture in the region near the substrate, which then react at the substrate to form a CZTSSe absorber layer for a solar cell.

20 Claims, 4 Drawing Sheets

(56) References Cited

U.S. PATENT DOCUMENTS

| | | | |
|---|---|---|---|
| 8,394,659 B1 | 3/2013 | Ding et al. | |
| 2007/0178225 A1* | 8/2007 | Takanosu | C23C 14/243 427/69 |
| 2008/0072962 A1* | 3/2008 | Ishizuka | H01L 31/072 136/264 |
| 2009/0258444 A1* | 10/2009 | Britt | C23C 14/024 438/5 |
| 2011/0094557 A1 | 4/2011 | Mitz et al. | |
| 2011/0263072 A1 | 10/2011 | Lee et al. | |
| 2012/0097234 A1 | 4/2012 | Bojarczuk et al. | |
| 2012/0100660 A1 | 4/2012 | Hagedorn et al. | |
| 2012/0295396 A1* | 11/2012 | Teeter | C23C 14/0629 438/95 |

OTHER PUBLICATIONS

B. Shin et al., "High efficiency Cu2ZnSnSe4 solar cells with a TiN diffusion barrier on the molybdenum bottom contact," 38th IEEE Photovoltaic Specialists Conference (PVSC), 2012, pp. 000671-000673.

C. P. Chan et al., "Growth and characterization of Cu2ZnSnS4 nanostructures using anodized aluminum as the growth mask," Proc. of SPIE, vol. 7411, 2009, 741108, 9 pages.

C. Persson et al., "Strong Valence-Band Offset Bowing of ZnO1-xSx Enhances p-Type Nitrogen Doping of ZnO-like Alloys," Physical Review Letters, vol. 97, No. 14, 2006, 146403, 4 pages.

E. Tournie et al., "p-type doping of Zn (Mg) BeSe epitaxial layers," Applied Physics Letters, vol. 75, No. 3, 1999, pp. 382-384.

* cited by examiner

IN SITU NITROGEN DOPING OF CO-EVAPORATED COPPER-ZINC-TIN-SULFO-SELENIDE BY NITROGEN PLASMA

BACKGROUND

The present invention relates to a method and apparatus for manufacturing a solar cell and, in particular, to controlling nitrogen doping levels in an absorber layer of a $Cu_2ZnSn(S,Se)_4$ (CZTSSe) solar cell.

A solar cell includes multiple layers of material, with each layer having a specific function with respect to operation of the solar cell. For example, the absorber layer of the solar cell is the light sensitive layer which captures light from the sun and creates electron-hole pairs which, if collected, produce an electrical current. Among other selection criteria, the absorber layer must have an appropriate doping density in order to achieve an optimal p-n junction (i.e. the junction which produces a built-in voltage in the device) when interfaced with the buffer layer. The doping density in the absorber is one parameter which can impact the voltage produced by the solar cell. An emerging material known as $Cu_2ZnSn(S,Se)_4$ (also known as CZTSSe) has been shown to be suitable for use as the absorber layer of a solar cell. Typical preparation methods for CZTSSe rely on intrinsic point defects in the material to produce the desirable doping density described above. However, the nature of intrinsic doping in CZTSSe is not well understood and is commonly difficult to control. Nitrogen has the potential to impact the doping density in CZTSSe. Therefore, it is of interest to find methods for incorporating nitrogen uniformly into CZTSSe.

SUMMARY

According to one embodiment of the present invention, a method of manufacturing a solar cell includes: placing a substrate of the solar cell in a vacuum chamber; placing elements of copper, zinc, tin, and one or more of sulfur and selenium in the vacuum chamber at a controlled distance with respect to the substrate; evaporating the elements to form elemental vapors in a region proximate the substrate; introducing a nitrogen plasma into the region to form a gas mixture of the elemental vapors and the nitrogen plasma in the region; and depositing the gas mixture at a surface of the substrate to form a CZTSSe absorber layer for the solar cell.

According to another embodiment of the present invention, an apparatus for manufacturing a CZTSSe solar cell includes: a chamber for mounting a solar cell substrate; a plurality of effusion cells within the chamber configured to evaporate copper, zinc, tin and one or more of sulfur and selenium to produce fluxes of elemental vapors in a region proximate the substrate; and a radio frequency (RF) source configured to introduce a nitrogen plasma into the region, wherein the elemental vapors and the nitrogen plasma form a gas mixture proximal to the substrate such that the vapors react at the substrate to form CZTSSe.

According to yet another embodiment of the present invention, a method of forming a CZTSSe absorber layer of a solar cell including: mounting a substrate in a vacuum chamber; evaporating copper, zinc, tin and one or more of sulfur and selenium to produce fluxes of elemental vapors in a region proximate the substrate; introducing a nitrogen plasma into the region to form a mixture with the elemental vapors near the substrate; and reacting the copper, zinc, tin and one or more of sulfur and selenium to form the CZTSSe absorber layer of the solar cell.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
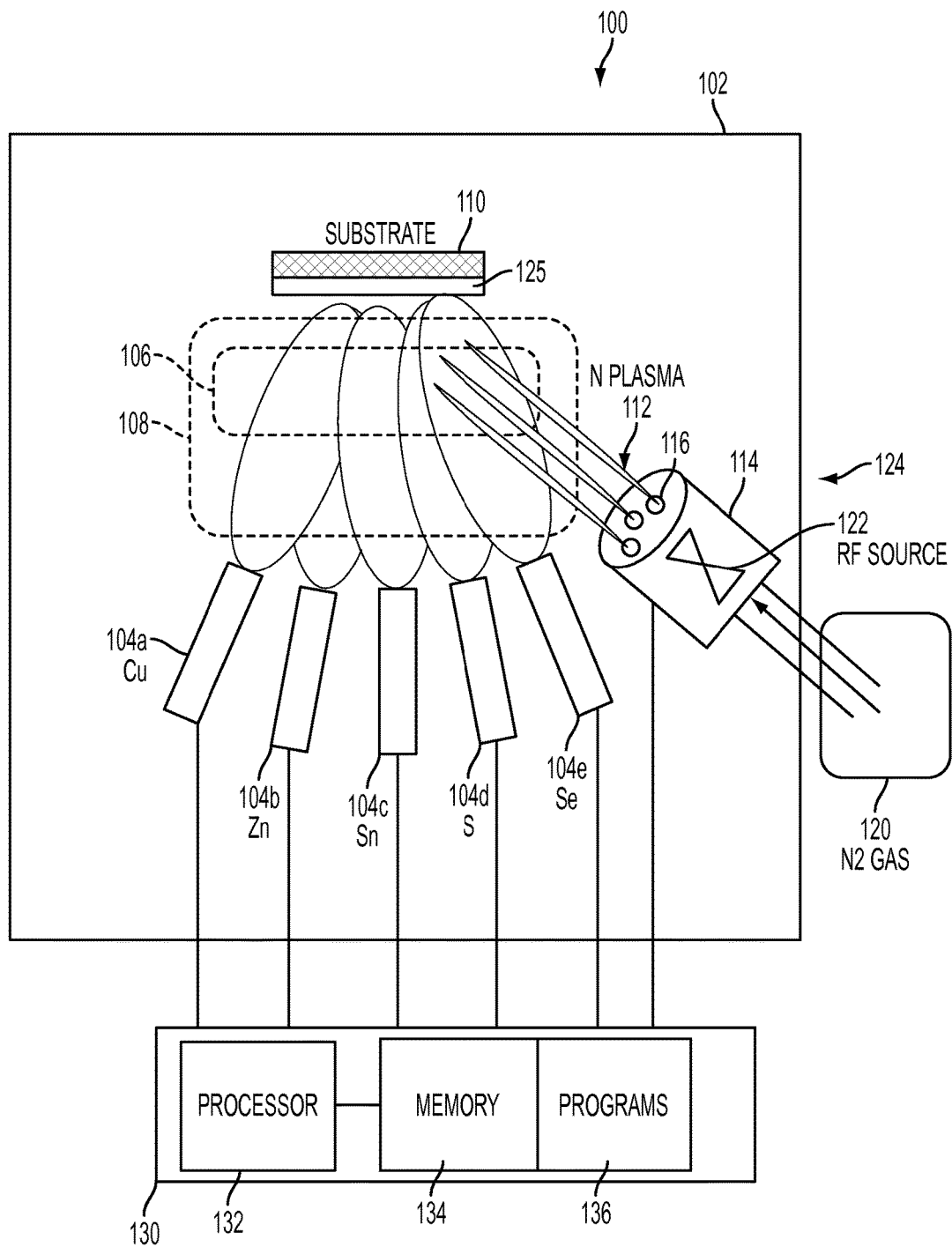
FIG. 1 shows an apparatus suitable for co-evaporating the individual elements onto a substrate of a solar cell in one embodiment of the present invention.

FIG. 1 shows an apparatus 100 suitable for depositing elements onto a substrate 110 of a solar cell in one embodiment of the present invention. The apparatus 100 includes a chamber 102 that can be evacuated so as to achieve high-vacuum (HV) or ultra-high vacuum (UHV) conditions, which are well-suited for thin film deposition. The chamber 102 includes one or more effusion cells 104a-e placed at controlled distances and angles with respect to a substrate 110. An effusion cell is an HV or UHV device containing an appropriate crucible filled with the desired material and a mechanism for heating the crucible and thereby evaporating the desired material. This vapor can then be deposited on the substrate 110. In an illustrative embodiment, the effusion cells 104a-e include a copper (Cu) effusion cell 104a (i.e., an effusion cell that contains and evaporates copper), a zinc (Zn) effusion cell 104b, a tin (Sn) effusion cell 104c, and a sulfur (S) effusion cell 104d. In some embodiments, a selenium (Se) effusion cell 104e may be used along with effusion cells 104a-d. The sulfur effusion cell may include an additional feature known as a "cracking zone" which thermally dissociates larger compounds such as S8, S4, etc. into elemental sulfur. The selenium effusion cell may similarly include a cracking zone. The sulfur and/or selenium cells may also be further equipped with a valve mechanism for controlling a flux of the elemental vapors of sulfur and/or selenium. Each effusion cell (104a-e) heats the crucible inside of it, which has been filled with the desired evaporant or material, to at or above the evaporation temperature of the material inside the crucible. As a selected effusion cell (e.g., Cu effusion cell 104a) is heated at or above the evaporation temperature of the material inside of it (e.g., Cu) a flux of elemental vapor is produced, which flux is directed towards region 108 and the substrate 110. In region 108, the elemental vapor (e.g., elemental Cu vapor) may mix with the other elemental vapors (e.g., elemental vapors of Zn, Sn, S, and/or Se) from the other effusions cells prior to deposition at the substrate 110. The evaporation rates of the elements may be controlled individually by varying the temperature in each effusion cell in order to obtain a final compound with a selected composition. The chamber 102 further includes a source 124 for introducing a nitrogen plasma (N-plasma) 112 into the region 108. The nitrogen plasma 112 introduced into region 108 mixes with the elemental vapors of Cu, Zn, Sn, S, and/or Se in region 106. The gas mixture 106 is subsequently deposited on the substrate 110 to form a CZTSSe absorber layer 125 (i.e., a light-sensitive layer) of the solar cell. While this embodiment is employs effusion cells, it is noted that a vacuum-compatible thin-film deposition source may be used.

In an alternate embodiment, the element (i.e., copper, zinc, tin and sulfur and/or selenium) may be introduced into the region using sputtering techniques. The elemental vapors may be produced by bombarding a solid elemental source with impinging species, such as argon atoms, etc. Various parameters of the sputtering process may be controlled to provide a selected atomic concentration in the region 108 for each of the elements. In another embodiment, the source elements may be "binary" materials that include combinations of the elements of the eventual absorber layer. Such binary materials may include, for example, $Cu_2S$, SnS, $SnS_2$, ZnS, etc. Such binary materials may be evaporated from the effusion cells described with respect to FIG. 1, or they may be released from sputtering targets.

Returning to FIG. 1, the nitrogen source 124 includes a nitrogen ($N_2$) reservoir 120 and a discharge tube 114 fitted with one or more aperture plates 116. The nitrogen source 124 includes a pathway for the nitrogen gas from the reservoir 120 to reach the discharge tube 114. A radio-frequency (RF) power coil 122 imparts energy (i.e., electrical power) to the nitrogen gas at a level sufficient to break some of the bonds in the $N_2$ gas, thereby producing a reactive nitrogen plasma 112. In one embodiment, the RF coil 122 is fitted around the discharge tube 114 through which nitrogen gas from the reservoir 120 passes into the vacuum chamber. The nitrogen plasma 112 then flows through the aperture plate(s) 116 into the region 108 to mix with the elemental gases in region 108. The gas mixture 106 (including the elemental vapors of Cu, Zn, Sn, S and/or Se and the nitrogen plasma 112) is directed towards the substrate 110 and is deposited on the substrate 110 to form the absorber layer 125 on the substrate 110. In HV or UHV thin film deposition with typical configuration of sources, substrates, and angles there-between, the evaporated material is not expected to undergo significant gas-gas collisions prior to reaching the substrate due to the low pressure inside the chamber. Thus, reaction to form CZTSSe occurs mainly at the substrate 110. The distribution of evaporated material reaching the substrate 110 is governed by the source-to-substrate distance and the angle between source and substrate 110.

Various methods are used to control the flux of reactive nitrogen 112 reaching region 108, and thus control the concentration of nitrogen expected to incorporate into the absorber layer 125. The size and density of holes in the aperture plate 116 can be selected to control the flux of the nitrogen plasma 112 arriving in region 108. In one embodiment, the cross-section of openings in the aperture plate 116 are selected to allow a controlled quantity of nitrogen (i.e., about 0.5 atomic percent) to incorporate into the resulting absorber layer 125. The atomic density of nitrogen in the region 108 may further be controlled by adjusting a flow rate of the nitrogen gas through the discharge tube 114. The chemical characteristics of the nitrogen plasma (i.e. the extent to which all $N_2$ bonds have been broken) may be controlled by adjusting the power of the RF coil 122.

FIG. 1 further includes a controller 130 configured to adjust the various operations of the apparatus 100, such as the evaporation rate of one or more of the effusion cells 104a-e, the flow rate of the nitrogen gas, the RF power applied to the coil around the nitrogen gas, etc. The controller 130 includes a processor 132 and a memory 134. The processor 132 has access to the memory and to various programs 136 contained therein. The processor 132 may perform the programs 136 in order to control an operation of the apparatus 100. In various embodiments, the memory 134 may include a non-transitory computer-readable medium, such as a solid state memory device.

Figure 2:
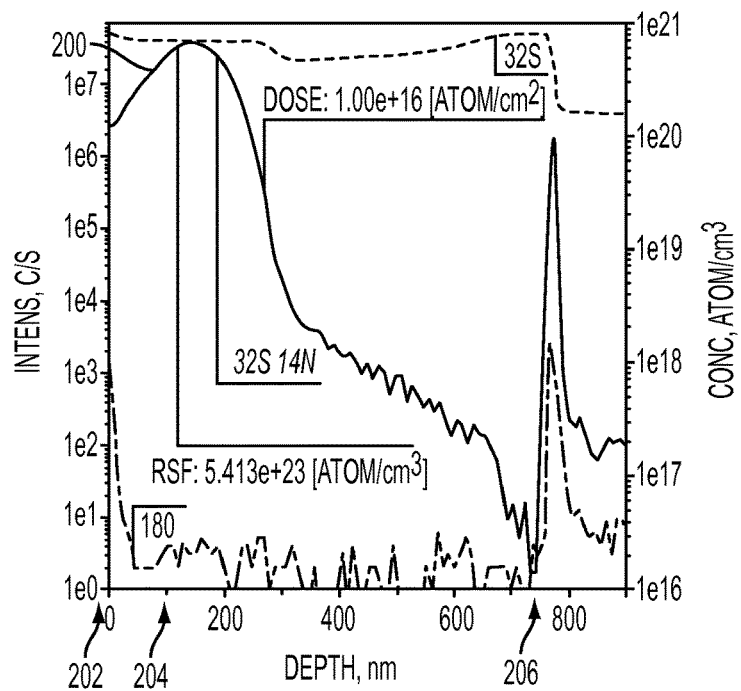
FIG. 2 shows a concentration profile of nitrogen in a CZTSSe absorber layer manufactured using conventional nitrogen ion-implantation methods.

FIG. 2 shows a concentration profile (200) of nitrogen in a CZTS absorber layer manufactured using a conventional nitrogen ion-implantation method. As shown in FIG. 2, the concentration of nitrogen at the surface (202) of the layer is about $1.6 \times 10^{20}$ atoms per cubic centimeter (atoms/$cm^3$) and increases to about $5.4 \times 10^{20}$ atoms/$cm^3$ at a penetration depth of about 100 nanometers (nm) (204). However, for penetration depths greater than 100 nm (204), the nitrogen concentration decreases with depth, so that the nitrogen concentration falls below $1 \times 10^{19}$ atoms/$cm^3$ by a depth of 300 nm and is negligible at a depth of about 750 nm (206). This highly non-uniform distribution of nitrogen throughout the CZTSSe layer may not be optimal for solar cell operation.

Figure 3:
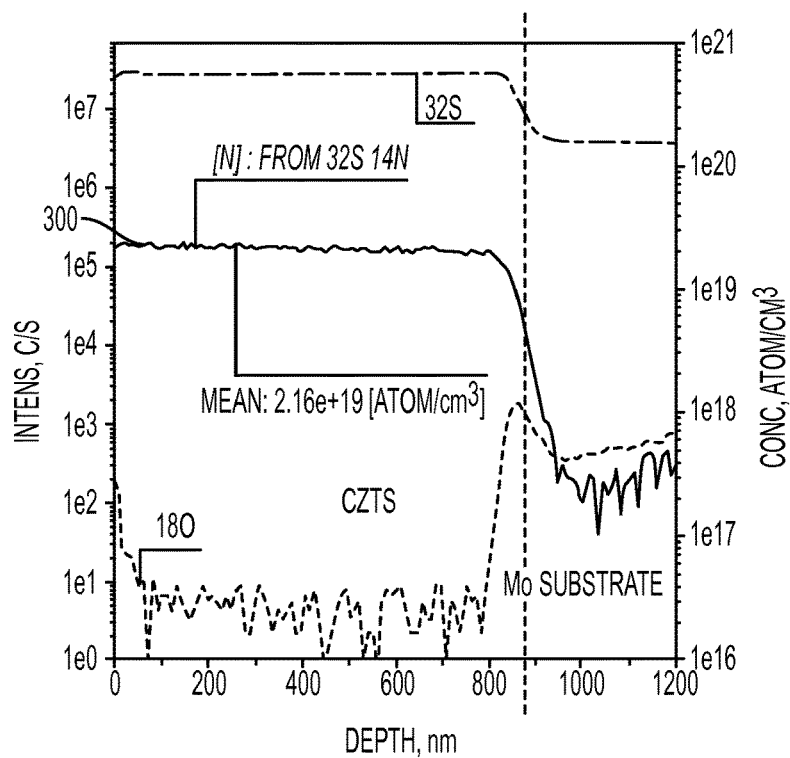
FIG. 3 shows a concentration profile of nitrogen in a CZTSSe absorber layer manufactured using the nitrogen plasma integration methods of the present invention.

FIG. 3 shows a concentration profile (300) of nitrogen in a CZTS absorber layer 125 manufactured using the nitrogen plasma incorporation methods of the present invention. The absorber layer 125 is doped in-situ with nitrogen by selecting an aperture plate (116, see FIG. 1) containing three holes through which the reactive nitrogen gas flows at a rate of 2 standard cubic centimeters per minute. The diameter of the holes may be between about 0.2 millimeters to about 1 millimeter. The RF power used to generate the reactive nitrogen gas is supplied by an RF power supply capable of delivering up to 600 Watts. Typical operation power is between about 400 Watts and about 500 Watts. The resulting nitrogen concentration is substantially more uniform ($2.16 \times 10^{19}$ atoms/$cm^3$ or about 0.1 atomic percent) between the surface (penetration depth=0 nm) and a penetration depth of 800 nm, i.e., over the entire thickness of the absorber layer 125.

Figure 4:
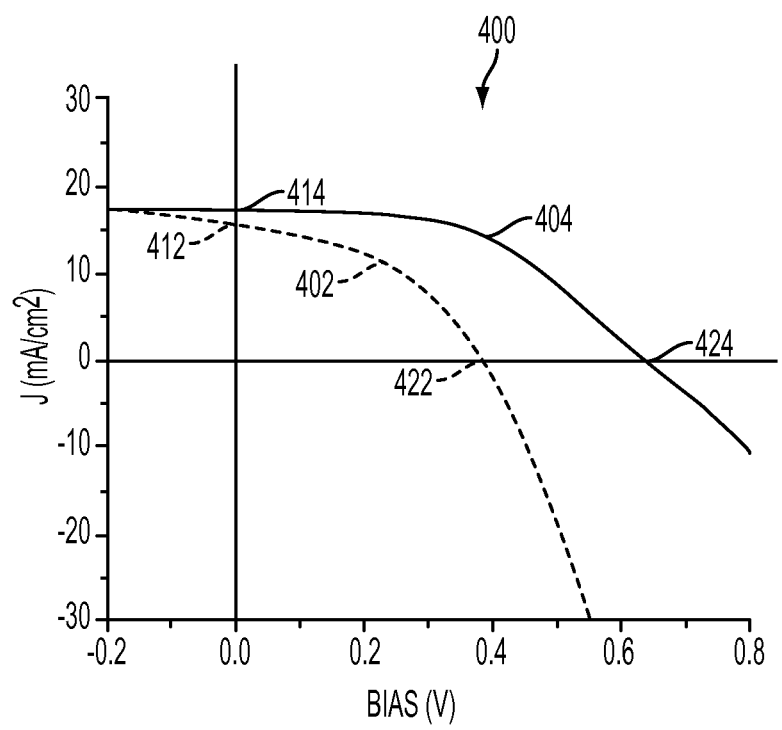
FIG. 4 shows an electrical response diagram for solar cells illustrating the effects of nitrogen plasma co-deposition techniques disclosed herein on the electrical properties of the CZTSSe absorber layer.

FIG. 4 shows an electrical response diagram for solar cells illustrating the effects of nitrogen plasma co-deposition techniques disclosed herein on the electrical properties of the CZTS-based solar cell. Curve 402 represents a response of a CZTS-based solar cell manufactured without using the N-plasma doping described herein. Curve 404 represents the response of a CZTS-based solar cell in which the CZTS film was prepared using the N-plasma doping method of the present invention. In particular, the CZTS solar cell related to curve 404 is manufactured by CZTS co-evaporation with in-situ Nitrogen on a Molybdenum/Soda Lime Glass (Mo/SLG) substrate. Post-deposition annealing is then performed at greater than 550° Celsius.

As shown in FIG. 4, the short-circuit current density of the device deposited in curve 402 (i.e., the current density of curve 402 when no bias voltage is applied) is about 15.5 mA/$cm^2$, as indicated at point 412. The short-circuit current density of the device depicted in curve 404 is about 17.2 mA/$cm^2$, as indicated at point 414. Thus, the CZTS layer of the present invention provides an increased photocurrent over the undoped CZTS layer. Additionally, the open-circuit voltage of the device depicted in curve 402 is about 383 mV (422) for the device containing the undoped CZTS layer, whereas this value is about 631 mV (424) for the device containing the doped CZTS layer (curve 404) of the present invention.

Table 1 compares various properties of devices containing the doped CZTS layer of the present invention compared to the devices containing an undoped CZTS layer. The row starting with "CZTS" displays the performance characteristics of a device that employs a doped CZTS absorber layer, and the row starting with "CZTS:N" displays the performance characteristics of a device employing an undoped CZTS absorber layer. The properties include efficiency ($\eta$, %), open-circuit voltage (Voc, mV), short-circuit current density (Jsc, mA/cm$^2$), fill factor (FF, %), and series resistance (Rs, Ohm-cm$^2$):

TABLE 1

|  | H | Voc (mV) | Jsc (mA/cm$^2$) | FF | Rs (Ohm-cm$^2$) |
|---|---|---|---|---|---|
| CZTS | 5.6% | 631 | 17.2 | 51.5% | 17.3 |
| CZTS (N) | 2.54% | 383 | 15.5 | 42.8% | 8.8 |

($V_{oc}$ and $J_{sc}$ are shown in FIG. 4 as well as in Table 1.) The properties shown in Table 1 show the performance advantages of devices employing the doped CZTS layer in a solar cell formed using the methods disclosed herein compared to those with an undoped CZTS layer formed via conventional methods.

Figure 5:
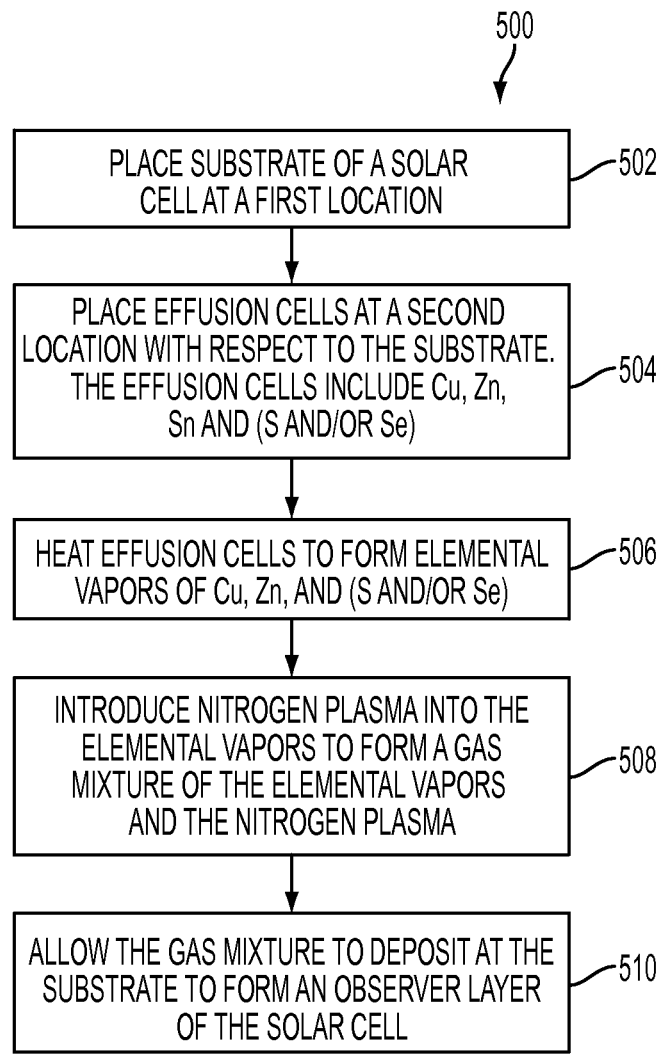
FIG. 5 shows a flow chart illustrating a method for manufacturing a CZTSSe solar cell according to the present invention.

FIG. 5 shows a flow chart 500 illustrating a method for manufacturing a CZTS solar cell according to the present invention. In Block 502, a substrate of the solar cell is placed in a chamber at a first location. In Block 504, effusion cells are placed at a controlled distance with respect to the substrate. The effusion cells each contain one of: elemental Cu, Zn, Sn S, and/or Se. In Block 506, the effusion cells heat the crucibles containing the target materials such that the materials (Cu, Zn, Sn, S, and/or Se) evaporate, thus releasing a flux of material into region 108 proximate the substrate 110. The temperatures in the effusion cells are selected so as to achieve appropriate elemental fluxes (Cu, Zn, Sn, S, and/or Se) to obtain a desirable CZTSSe film composition. In Block 508, a nitrogen plasma is introduced into the chamber at an angle such that it will mix with the other elemental vapors. In Block 510, the elemental vapors all impinge upon the substrate, thereby depositing and forming the CZTS absorber layer of the solar cell.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An apparatus for manufacturing a CZTSSe layer for a solar cell, comprising:
    a chamber for mounting a solar cell substrate;
    a copper effusion cell, a zinc effusion cell, a tin effusion cell and a one or more of sulfur and selenium effusion cells of a plurality of effusion cells within the chamber configured to evaporate copper, zinc, tin and one or more of sulfur and selenium to produce fluxes of elemental vapors in a region proximate the substrate;
    a radio frequency (RF) source separate from the plurality of effusion cells, the RF source configured to introduce a nitrogen plasma into the region, wherein the elemental vapors and the nitrogen plasma form a gas mixture in the region such that the vapors react at the substrate to form CZTSSe; and
    a processor configured to control the plurality of effusion cells to evaporate the copper, zinc, tin and one or more of sulfur and selenium to obtain elemental vapors of a selected composition and to control the introduction of the nitrogen plasma into the region.

2. The apparatus of claim 1, wherein the plurality of effusion cells include binary materials composed of at least two of the elements of copper, zinc, tin, sulfur and selenium.

3. The apparatus of claim 1, further comprising a controller configured to control the evaporation rates of the elements to obtain a selected CZTSSe film composition.

4. The apparatus of claim 1, wherein the RF source is configured to pass a nitrogen ($N_2$) gas through an RF coil to break bonds in the $N_2$ gas thereby to produce a nitrogen plasma or reactive nitrogen gas.

5. The apparatus of claim 4, wherein the RF source is fitted with at least one aperture plate, such that the nitrogen plasma passes through the aperture plate prior to reaching the reaction region.

6. The apparatus of claim 5, wherein the RF source is further configured to control the flux and chemical characteristic of the nitrogen plasma by controlling at least one of: an RF power; a flow rate of $N_2$; and a size and density of holes in the aperture plate.

7. The apparatus of claim 6, wherein a diameter of the holes in the aperture plate is about 0.2-1.0 millimeters.

8. An apparatus for manufacturing a solar cell, comprising:
- a chamber for mounting a solar cell substrate;
- a plurality of effusion cells comprising a copper effusion cell, a zinc effusion cell, a tin effusion cell and a one or more of sulfur and selenium effusion cells within the chamber at a controlled distance with respect to the solar cell substrate, the plurality of effusion cells configured to evaporate copper, zinc, tin and one or more of sulfur and selenium to produce fluxes of elemental vapors in a region proximate the substrate;
- a radio frequency (RF) source separate from the plurality of effusion cells, the RF source configured to introduce a nitrogen plasma into the region, wherein the elemental vapors and the nitrogen plasma form a gas mixture in the region such that the vapors react at the substrate to form a CZTSSe layer of the solar cell; and
- a processor configured to control the plurality of effusion cells to evaporate the copper, zinc, tin and one or more of sulfur and selenium to obtain elemental vapors of a selected composition and to control the introduction of the nitrogen plasma into the region.

9. The apparatus of claim 8, wherein the plurality of effusion cells includes binary materials composed of at least two of the elements of copper, zinc, tin, sulfur and selenium.

10. The apparatus of claim 8, further comprising a controller configured to control the evaporation rates of the elements to obtain a selected CZTSSe film composition.

11. The apparatus of claim 8, wherein the RF source is configured to pass a nitrogen ($N_2$) gas through an RF coil to break bonds in the $N_2$ gas thereby to produce a nitrogen plasma or reactive nitrogen gas.

12. The apparatus of claim 11, wherein the RF source is fitted with at least one aperture plate, such that the nitrogen plasma passes through the aperture plate prior to reaching the reaction region.

13. The apparatus of claim 12, wherein the RF source is further configured to control the flux and chemical characteristic of the nitrogen plasma by controlling at least one of: an RF power; a flow rate of $N_2$; and a size and density of holes in the aperture plate.

14. The apparatus of claim 13, wherein a diameter of the holes in the aperture plate is about 0.2-1.0 millimeters.

15. An apparatus for manufacturing a CZTSSe layer for a solar cell, comprising:
- a chamber for mounting a solar cell substrate;
- a copper effusion cell, a zinc effusion cell, a tin effusion cell and a one or more of sulfur and selenium effusion cells of a plurality of effusion cells within the chamber configured to evaporate copper, zinc, tin and one or more of sulfur and selenium to produce fluxes of elemental vapors in a region proximate the substrate;
- a radio frequency (RF) source separate from the plurality of effusion cells, the RF source configured to introduce a nitrogen plasma into the region, wherein the elemental vapors and the nitrogen plasma form a gas mixture in the region such that the vapors react at the substrate to form CZTSSe;
- a controller configured to control the evaporation rates of the elements to obtain a selected CZTSSe film composition; and
- a processor configured to control the plurality of effusion cells to evaporate the copper, zinc, tin and one or more of sulfur and selenium to obtain elemental vapors of a selected composition and to control the introduction of the nitrogen plasma into the region.

16. The apparatus of claim 15, wherein the plurality of effusion cells include binary materials composed of at least two of the elements of copper, zinc, tin, sulfur and selenium.

17. The apparatus of claim 15, wherein the RF source is configured to pass a nitrogen ($N_2$) gas through an RF coil to break bonds in the $N_2$ gas thereby to produce a nitrogen plasma or reactive nitrogen gas.

18. The apparatus of claim 17, wherein the RF source is fitted with at least one aperture plate, such that the nitrogen plasma passes through the aperture plate prior to reaching the reaction region.

19. The apparatus of claim 18, wherein the RF source is further configured to control the flux and chemical characteristic of the nitrogen plasma by controlling at least one of: an RF power; a flow rate of $N_2$; and a size and density of holes in the aperture plate.

20. The apparatus of claim 19, wherein a diameter of the holes in the aperture plate is about 0.2-1.0 millimeters.

* * * * *